US009886995B2

(12) United States Patent
Hwang

(10) Patent No.: US 9,886,995 B2
(45) Date of Patent: Feb. 6, 2018

(54) SEMICONDUCTOR DEVICE AND DRIVING METHOD THEREOF

(71) Applicant: SK hynix Inc., Gyeonggi-do (KR)

(72) Inventor: Jeong-Jin Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/099,014

(22) Filed: Apr. 14, 2016

(65) Prior Publication Data

US 2017/0133084 A1    May 11, 2017

(30) Foreign Application Priority Data

Nov. 11, 2015    (KR) .......................... 10-2015-0158128

(51) Int. Cl.
| | | |
|---|---|---|
| *G11C 11/4094* | (2006.01) | |
| *G11C 11/4091* | (2006.01) | |
| *G11C 11/4093* | (2006.01) | |
| *G11C 11/4076* | (2006.01) | |
| *G11C 7/06* | (2006.01) | |
| *G11C 7/08* | (2006.01) | |

(52) U.S. Cl.
CPC .......... *G11C 11/4094* (2013.01); *G11C 7/065* (2013.01); *G11C 7/08* (2013.01); *G11C 11/4076* (2013.01); *G11C 11/4091* (2013.01); *G11C 11/4093* (2013.01)

(58) Field of Classification Search
CPC .................. G11C 11/4094; G11C 11/4076
USPC ........................................................ 365/149
See application file for complete search history.

(56) References Cited

U.S. PATENT DOCUMENTS

| | | | | |
|---|---|---|---|---|
| 2009/0303804 A1* | 12/2009 | Chi | .......................... | G11C 7/12 365/189.11 |
| 2011/0075491 A1* | 3/2011 | Yun | ........................ | G11C 5/147 365/189.11 |
| 2012/0275250 A1* | 11/2012 | Kim | ..................... | G11C 11/4091 365/203 |
| 2014/0064005 A1* | 3/2014 | Jang | ........................ | G11C 7/08 365/207 |

FOREIGN PATENT DOCUMENTS

| | | |
|---|---|---|
| KR | 1020110035748 | 4/2011 |
| KR | 1020150144171 | 12/2015 |

\* cited by examiner

*Primary Examiner* — Son Mai
*Assistant Examiner* — Muna A Techane
(74) *Attorney, Agent, or Firm* — IP & T GROUP LLP

(57) ABSTRACT

A semiconductor device includes a sense amplification unit suitable for sensing and amplifying data loaded on a data line pair; a pull-up driving unit suitable for supplying a first voltage to a pull-up power line of the sense amplification unit as a pull-up driving voltage in an active mode, and supplying second voltage higher than the first voltage to the pull-up power line as the pull-up driving voltage during an initial period of a precharge mode; a pull-down driving unit suitable for supplying a third voltage to a pull-down power line of the sense amplification unit as a pull-down driving voltage during the active mode and the initial period of the precharge mode; and a post over-driving control unit suitable for adjusting the initial period of the precharge mode by detecting a voltage level of the pull-up power line.

21 Claims, 5 Drawing Sheets

SEMICONDUCTOR DEVICE AND DRIVING METHOD THEREOF

CROSS-REFERENCE TO RELATED APPLICATIONS

The present application claims priority of Korean Patent Application No. 10-2015-0158128, filed on Nov. 11, 2015, which is incorporated herein by reference in its entirety.

BACKGROUND

1. Field

Various embodiments of the present invention relate to a semiconductor design technology, and more particularly, to a semiconductor device including a sense amplification unit.

2. Description of the Related Art

A Dynamic Random Access Memory (DRAM) is representative example of a volatile semiconductor memory device. A memory cell of a DRAM includes a cell capacitor for storing electrical charges representing binary data and a cell transistor serving as a switch controlling the flow of the electrical charges to and from the cell capacitor.

Because electrical charges may be introduced into or discharged from the cell capacitor unintentionally due to a leakage current phenomenon, it is generally necessary to periodically perform a data re-writing operation for preserving the integrity of the stored data. Such operation is commonly known as a refresh operation. It a refresh operation, an active mode and a precharge mode are repetitively performed at predetermined regular intervals. In an active mode, as the memory cell is selected and a bit line sense amplifier is enabled, the bit line sense amplifier senses and amplifies data transferred from the selected memory cell, and transfers the amplified data back to the memory cell. In a precharge mode, as the memory cell is not selected and the bit line sense amplifier is disabled, the memory cell retains data stored therein.

As the memory cell density increases in order to increase the memory capacity of semiconductor memory devices the leakage current also increases. As a result, the data retention time of a memory cell within which data stored in a cell capacitor may be reliably maintained after a precharge operation, becomes shorter. Hence, improved technology is needed to address such concerns.

SUMMARY

Various embodiments of the present invention are directed to a semiconductor device capable of improving a data retention time of a memory cell, and a driving method of the semiconductor device.

Further, various embodiments of the present invention are directed to a semiconductor device capable of improving a time for performing a data re-writing operation, and a driving method of the semiconductor device.

In an embodiment a sense amplification unit suitable for sensing and amplifying data loaded on a data line pair; a pull-up driving unit suitable for supplying a first voltage to a pull-up power line of the sense amplification unit as a pull-up driving voltage in an active mode, and supplying second voltage higher than the first voltage to the pull-up power line as the pull-up driving voltage during an initial period of a precharge mode; a pull-down driving unit suitable for supplying a third voltage to a pull-down power line of the sense amplification unit as a pull-down driving voltage during the active mode and the initial period of the precharge mode; and a post over-driving control unit suitable for adjusting the initial period of the precharge mode by detecting a voltage level of the pull-up power line.

The pull-up driving unit may include: a first pull-up driving section suitable for driving the pull-up power line by the first voltage in response to a first pull-up driving signal in the active mode; and a second pull-up, driving section suitable for driving the pull-up power line by the second voltage in response to a second pull-up driving signal during the initial period of the precharge mode, wherein the post over-driving control unit adjusts a pulse width of the second pull-up driving signal.

The post over-driving control unit may include: a set pulse generating unit suitable for detecting the driven level of the pull-up power line during the initial period of the precharge mode, and generating a set pulse in response to the detected driven level; and a third pull-up driving signal generating unit suitable for generating the third pull-up driving signal in response to the set pulse and a reset pulse.

The set pulse generating unit may include: a reference voltage generation section suitable for dividing the second voltage to generate a first reference voltage and a second reference voltage that is higher than the first reference voltage; a comparison section suitable for comparing a voltage level of the pull-up power line with the first and second reference voltages; a determining section suitable for determining the voltage level of the pull-up power line based on the comparison result of the comparison section to generate detection signals; and a pulse width control section suitable for adjusting an activation timing of the set pulse in response to the detection signals.

The pulse width control section may include: an up/down counter suitable for performing a counting up/down operation in response to the detection signals to generate counting signals; a latch suitable for latching the counting signals to output a pulse width information; a decoder suitable for decoding the outputted pulse width information to generate pulse signals; and an output part suitable for outputting the set pulse having an activation timing corresponding to an activated signal of the pulse signals.

The comparison section may include: a first comparator suitable for comparing the voltage level of the pull-up power line with the first reference voltage; and a second comparator suitable for comparing the voltage level of the pull-up power line with the second reference voltage.

The determining section may activate a first detection signal when the voltage level of the pull-up power line is determined to be lower than the first reference voltage, activates a second detection signal when the voltage level of the pull-up power line is determined to be higher than the second reference voltage, and activates a third detection signal when the voltage level of the pull-up power line is determined to be higher than the first reference voltage and lower than the second reference voltage.

The up/down counter may perform the counting up/down operation in response to the first and second detection signals and may hold the counting up/down operation when the third detection signal is activated.

The semiconductor device may further include: a first precharge unit suitable for precharging the data line pair by a precharge voltage during a remaining period of the precharge mode; and a second precharge unit suitable for precharging the pull-up power line and the pull-down power line by the precharge voltage during the remaining period of the precharge mode, wherein the precharge voltage has a voltage level corresponding to a half of the first voltage.

The first voltage may include a core voltage generated by voltage-dropping a power supply voltage VDD supplied from an external, the second voltage includes a boosted voltage generated by boosting the power supply voltage, the third voltage includes a ground voltage supplied from the external, and the precharge voltage includes a bit line precharge voltage.

In an embodiment, a semiconductor device may include: a bit line pair; a memory cell coupled to one of the bit line pair; a sense amplification unit suitable for sensing and amplifying data loaded on the bit line pair; a pull-up driving unit suitable for supplying a first voltage to a pull-up power line of the sense amplification unit as a pull-up driving voltage during an initial period of an active mode, supplying a second voltage lower than the first voltage to the pull-up power line as the pull-up driving voltage during a remaining period of the active mode and supplying a third voltage higher than the first voltage to the pull-up power line as the pull-up driving voltage during an initial period of a precharge mode; a pull-down driving unit suitable for supplying a fourth voltage to a pull-down power line of the sense amplification unit as a pull-down driving voltage during the active mode and the initial period of the precharge mode; a post over-driving control unit suitable for adjusting the initial period of the precharge mode by detecting a voltage level of the pull-up power line; and a first precharge unit suitable for precharging the bit line pair by a precharge voltage during a remaining period of the precharge mode.

The pull-up driving unit may include: a first pull-up driving section suitable for driving the pull-up power line by the first voltage in response to a first, pull-up driving signal during the initial period of the active mode; a second pull-up driving section suitable for driving the pull-up power line by the second voltage in response to a second pull-up driving signal during the remaining period of the active mode; and a third pull-up driving section suitable for driving the pull-up power line by the third voltage in response to a third pull-up driving signal during the initial period of the precharge mode.

The post over-driving control unit may include: a set pulse generating unit suitable for detecting the driven level of the pull-up power line during the initial period of the precharge mode, and generating a set pulse in response to the detected driven level; and a third pull-up driving signal generating unit suitable for generating the third pull-up driving signal in response to the set pulse and a reset pulse.

The post over-driving control unit may include: a reference voltage generation section suitable for dividing the third voltage to generate a first reference voltage and a second reference voltage that is higher than the first reference voltage; a comparison section suitable for comparing a voltage level of the pull-up power line with the first and second reference voltages; a determining section suitable for determining the voltage level of the pull-up power line based on the comparison result of the comparison section to generate detection signals; and a pulse width control section suitable for adjusting an activation timing of the set pulse in response to the detection signals.

The pulse width control section may include: an up/down counter suitable for performing a counting up/down operation in response to the detection signals to generate counting signals, a latch suitable for latching the counting signals to output a pulse width information; a decoder suitable for decoding the outputted pulse width information to generate pulse signals; and an output part suitable for outputting the set pulse having an activation timing corresponding to an activated signal of the pulse signals.

The comparison section may include: a first comparator suitable for comparing the voltage level of the pull-up power line with the first reference voltage; and a second comparator suitable for comparing the voltage level of the pull-up power line with the second reference voltage.

The determining section may activate a first detection signal when the voltage level of the pull-up power line is determined to be lower than the first reference voltage, activates a second detection signal when the voltage level of the pull-up power line is determined to be higher than the second reference voltage, and activates a third detection signal when the voltage level of the pull-up power line is determined to be higher than the first reference voltage and lower than the second reference voltage.

The up/down counter may perform the counting up/down operation in response to the first and second detection signals and may hold the counting up/down operation when the third detection signal is activated.

The first voltage may include a power supply voltage supplied from an external and the fourth voltage includes a ground voltage supplied from the external.

The second voltage may include a core voltage generated by voltage-dropping the power supply voltage and the third voltage includes a boosted voltage generated by boosting the power supply voltage, wherein the precharge voltage has a voltage level corresponding to a half of the core voltage.

The semiconductor device may further include: a second precharge unit suitable for precharging the pull-up power line and the pull-down power line by the precharge voltage during the remaining period of the precharge mode.

In an embodiment, a semiconductor device may include: a sense amplifier suitable for sensing and amplifying data loaded on a data line pair; a driving unit suitable for driving a power line of the sense amplifier by a post over-driving voltage based on a post over-driving signal; and a post over-driving control unit suitable for detecting the driven level of the power line, and adjusting a pulse width of the post over-driving signal based on the detected level of the power line.

In an embodiment, a driving method of a semiconductor device may include: driving a power line of a sense amplifier by a post over-driving voltage based on a post over-driving signal; detecting the driven level of the power line to adjust a pulse width of the post over-driving signal based on the detected level of the power line; and driving the power line by the post over-driving voltage based on the adjusted post over-driving signal.

DETAILED DESCRIPTION

Figure 1:
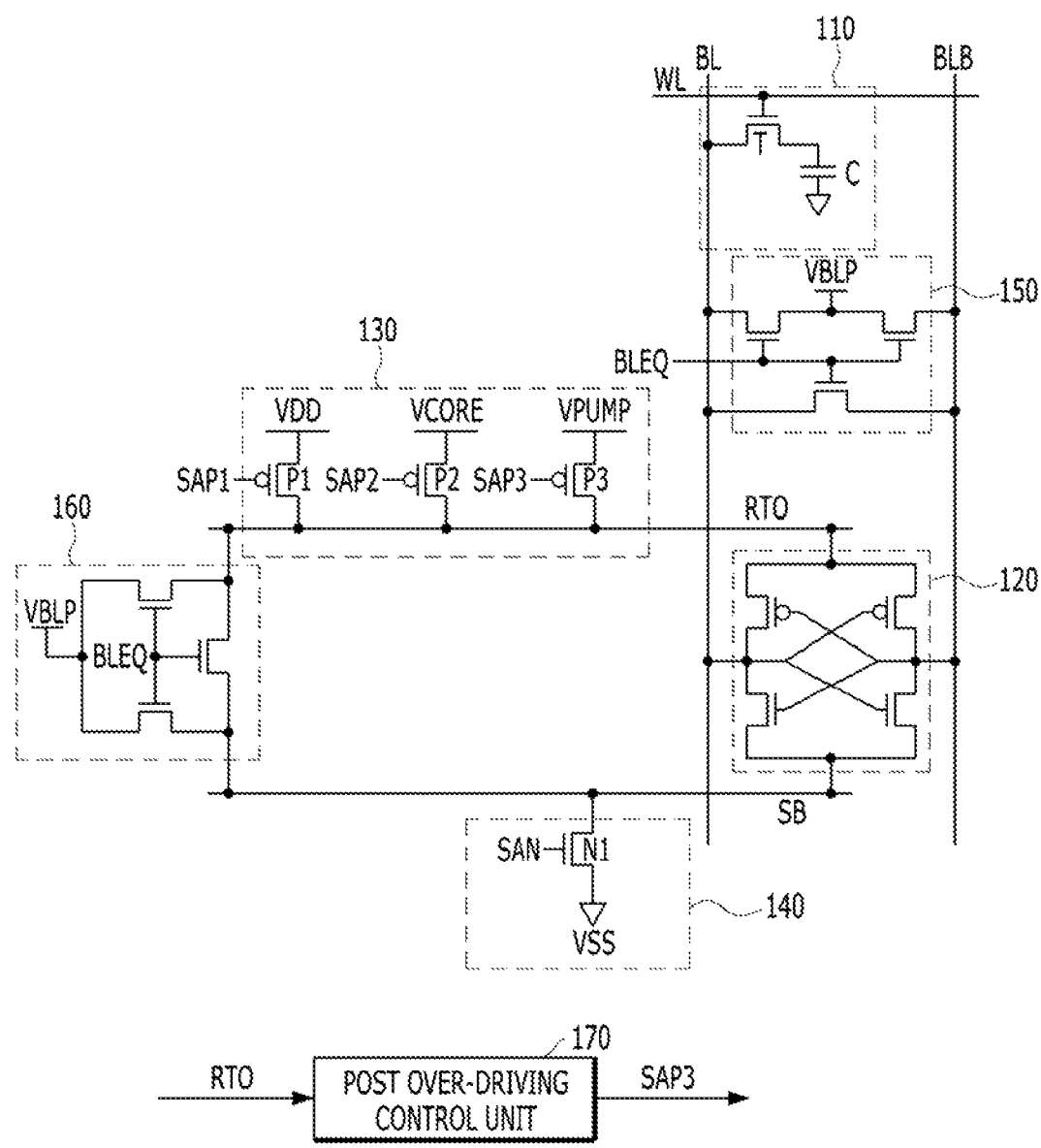
FIG. 1 is a diagram illustrating a semiconductor device in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and veil fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned otherwise.

FIG. 1 is a diagram illustrating a semiconductor memory device in accordance with an embodiment of the present invention.

Referring to FIG. 1, the semiconductor memory device may include a bit line pair (also referred to as "a data line pair") including a bit line BL and a complementary bit line BLB, a memory cell 110, a sense amplification unit 120, a pull-up driving unit 130, a pull-down driving unit 140, a first precharge unit 150, a second precharge unit 160, and a post over-driving (POD) control unit 170.

The memory cell 110 may be coupled to any one of the bit line BL and the complementary bit line BLB, and may include a cell capacitor C and a cell transistor T. For example, the cell capacitor C may be coupled between a plate node and a storage node, and the cell transistor T may include an NMOS transistor having a gate coupled to a word line WL, a source coupled to the bit line BL, and a drain coupled to the storage node. The plate node may be biased with a ground voltage VSS.

The sense amplification unit 120, that is a bit line sense amplifier (BLSA), may sense and amplify data loaded on the bit line pair BL and BLB by a driving voltage supplied through a pull-up power line RTO and a pull-down power line SB. For example, the sense amplification unit 120 may include a cross-coupled latch type amplifier.

The pull-up driving unit 130 may include a first pull-up driving section P1, a second pull-up driving section P2, and a third pull-up driving section P3. The first pull-up driving section P1 may drive the pull-up power line RTO by an external power supply voltage VDD (i.e., an over-driving voltage) having a level higher than a core voltage VCORE, during a first active period (i.e., over-driving period) of an active mode in response to a first pull-up driving signal SAP1 (i.e., an over-driving signal). The second pull-up driving section P2 may drive the pull-up power line RTO by the core voltage VCORE (i.e., a normal driving voltage) during a second active period of the active mode in response to a second pull-up driving signal SAP2 (i.e., a normal driving signal). The third pull-up driving section P3 may drive the pull-up power line RTO by a boosted voltage VPUMP (i.e., a post over-driving voltage) having a level higher than the power supply voltage VDD, during an initial period of a precharge mode (i.e., a post over-driving period) in response to a third pull-up driving signal SAP3 (i.e., a post over-driving signal). For example, the first pull-up driving section P1 may include a first PMOS transistor having a gate receiving the first pull-up driving signal SAP1 and a source and a drain coupled between a power supply voltage VDD terminal and the pull-up power line RTO. The second pull-up driving section P2 may include a second PMOS transistor having a gate receiving the second pull-up driving signal SAP2 and a source and a drain coupled between a core voltage VCORE terminal and the pull-up power line RTO. The third pull-up driving section P3 may include a third PMOS transistor having a gate receiving the third pull-up driving signal SAPS and a source and a drain coupled between a boosted voltage VPUMP terminal and the pull-up power line RTO.

The pull-down driving unit 140 may include a first pull-down driving section N1. The first pull-down driving section N1 may drive the pull-down power line SB by a ground voltage VSS during an entire period of the active mode and the initial period of the precharge period (i.e., a BLSA enable period) in response to a pull-down driving signal SAN. For example, the first pull-down driving section N1 may include a first NMOS transistor having a gate receiving the pull-down driving signal SAN and a source and a drain coupled between the ground voltage VSS and the pull-down power line SB.

The first precharge unit 150 may precharge the bit line pair BL and BLB by a bit line precharge voltage VBLP in response to an equalization signal BLEQ in a precharge mode. The second precharge unit 160 may precharge the pull-up power line RTO and the pull-down power line SB by the bit line precharge voltage VBLP in response to the equalization signal BLEQ in the precharge mode. For reference, the bit line pair BL and BLB and the power line pair RTO and SB may be precharged by the bit line precharge voltage VBLP after the post over-driving period.

The core voltage VCORE, the bit line precharge voltage VBLP, and the boosted voltage VPUMP may be internal voltages internally generated using the power supply voltage VDD applied from an external source. For example, the core voltage VCORE may be generated by reducing the power supply voltage VDD, the bit line precharge voltage VBLP may be generated by dividing the core voltage VCORE (e.g., VBLP=VCORE/2), and the boosted voltage VPUMP may be generated by boosting the power supply voltage VDD, for example, using a charge pumping method. Accordingly, the bit line precharge voltage VBLP may have a voltage level lower than that of the core voltage VCORE, the core voltage VCORE may have a voltage level lower than that of the power supply voltage VDD, and the boosted voltage VPUMP may have a voltage level higher than that of the power supply voltage VDD.

The post over-driving control unit 170 may detect a post over driven (POD) voltage level of the pull-up power line RTO to generate the third pull-up driving signal SAP3. A pulse width (i.e., an activation timing) of the third pull-up driving signal SAP3 may be adjusted based on the detected POD voltage level. For example, the POD voltage level may be detected when exiting from the post over-driving period, and the third pull-up driving signal SAP3, having an adjusted pulse width based on the detected POD voltage level, may be used in the next active/precharge modes.

Figure 2:
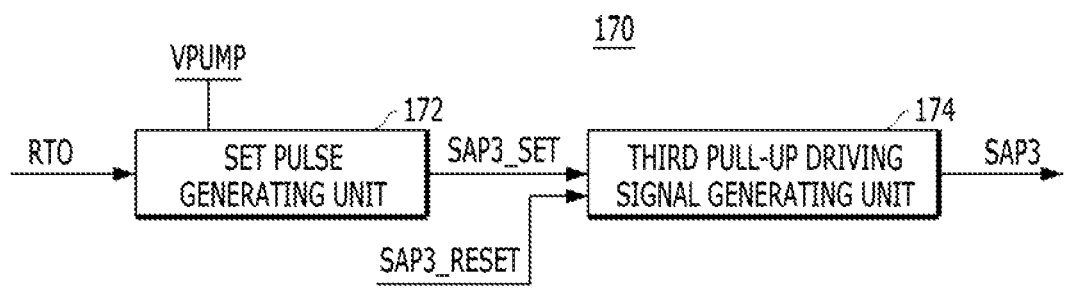
FIG. 2 is a detailed diagram of a post over-driving (POD) control unit illustrated in FIG. 1.

FIG. 2 is a detailed diagram of the post over-driving control unit 170 illustrated in FIG. 1.

Referring to FIG. 2, the post over-driving control unit 170 may include a set pulse generating unit 172 and a third pull-up driving signal generating unit 174.

The set pulse generating unit 172 may detect the POD voltage level of the pull-up power line RTO by using the boosted voltage VPUMP, and generate a set pulse SAP3_SET in response to the detected POD voltage level.

The third pull-up driving signal generating unit 174 may generate the third pull-up driving signal SAPS in response to the set pulse SAP3_SET and a reset pulse SAP3_RESET. For reference, the reset pulse SAP_RESET may be activated when the pull-down driving signal SAN is deactivated based on a precharge command PCG (see FIGS. 4 and 5). Furthermore, the third pull-up driving signal generating unit 174 may include an SR latch that is set in response to the set pulse SAP3_SET and reset in response to the reset pulse SAP3_RESET. Accordingly, the reset pulse SAP3_RESET may have a fixed activation timing and the set pulse SAP3_SET a variable activation timing, and thus a pulse width may be adjusted based on the third pull-up driving signal SAPS.

Figure 3:
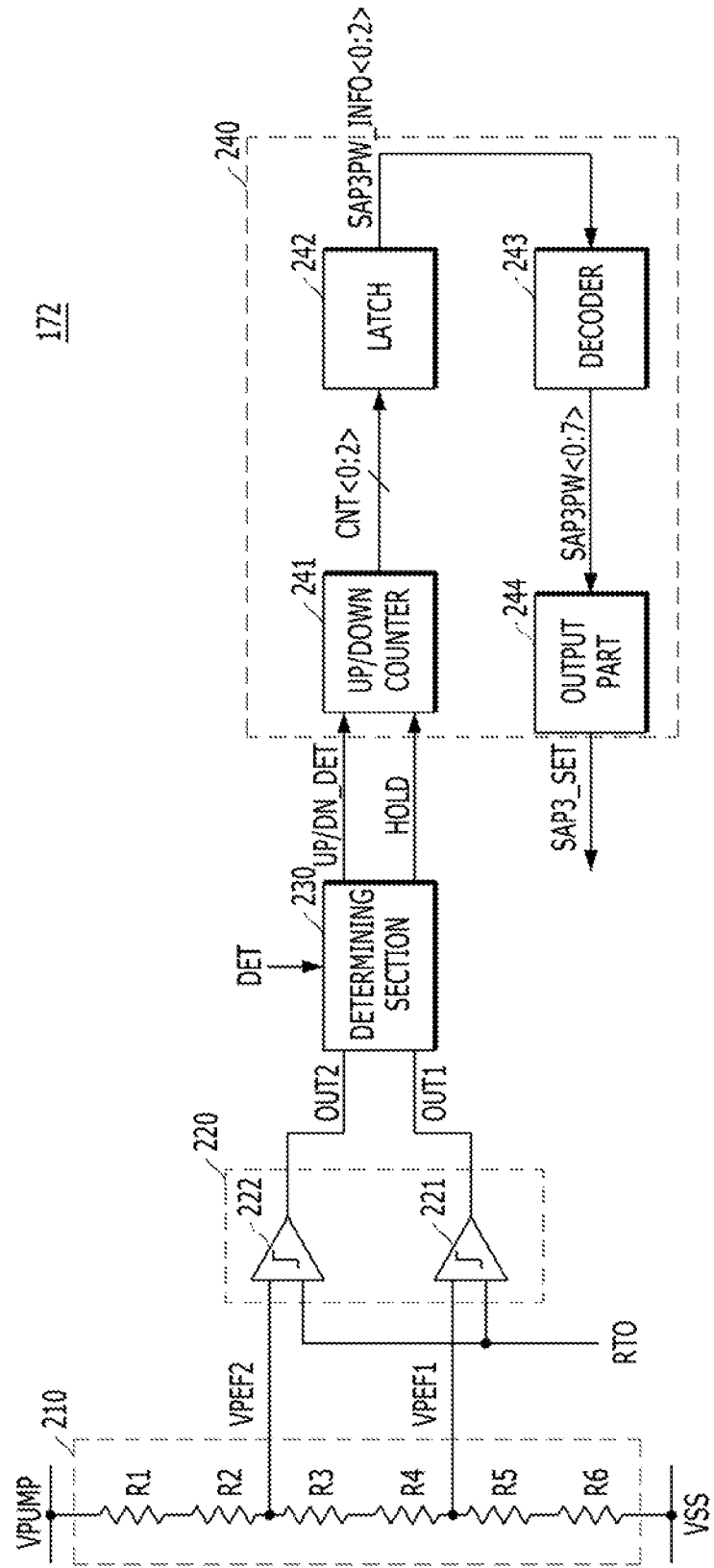
FIG. 3 is a detailed diagram of a set pulse generating unit illustrated in FIG. 2.

FIG. 3 is a detailed diagram of the set pulse generating unit 172 shown in FIG. 2.

Referring to FIG. 3, the set pulse generating unit 172 may include a reference voltage generation section 210, a comparison section 220, a determining section 230, and a pulse width control section 240.

The reference voltage generation section 210 may include a plurality of resistor elements R1 to R6 coupled between a boosted voltage VPUMP terminal and a ground voltage VSS terminal. The resistor elements R1 to R6 may divide the boosted voltage VPUMP to generate the first and second reference voltages VREF1 and VREF2. The voltage level of the first reference voltage VREF1 may be lower than that of the second reference voltage VREF2. The respective resistor elements R1 to R6 may have resistances selected based on a particular design.

The comparison section 220 may include a first comparator 221 and a second comparator 222. The first comparator 221 may compare a post over-driven (POD) voltage level of the pull-up power line RTO with the first reference voltage VREF1 to output a first comparison signal OUT1, and the second comparator 222 may compare the post over-driven (POD) voltage level with the second reference voltage VREF2 to output a second comparison signal OUT2. In other words the comparison section 220 may detect the post over-driven (POD) voltage level on the basis of the first and second reference voltages VREF1 and VREF2.

The determining section 230 may receive the first and second comparison signals OUT1 and OUT2, determine the POD voltage level in response to a determination signal DET, and output detection signals UP_DET, DN_DET, and HOLD. The first detection signal UP_DET may be activated when the POD voltage level is determined to be lower than that of the first reference voltage VREF1. The second detection signal DN_DET may be activated when the POD voltage level is determined to be higher than that of the second reference voltage VREF2. The third detection signal HOLD may be outputted when the POD voltage level is determined to be higher than that of the first reference voltage VREF1 and lower than that of the second reference voltage VREF2. The determination signal DET is activated when exiting from the post over-driving period. For example, the determination signal DET may be activated when the third pull-up driving signal SAP3 (or the pull-down driving signal SAN) is deactivated based on a precharge command PCG (see FIG. 4).

The pulse width control section 240 may adjust an activation timing of the set pulse SAP3_SET in response to the detection signals UP_DET, DN_DET, and HOLD.

The pulse width control section 240 may include an up/down counter 241, a latch 242, a decoder 243, and an output part 244.

The up/down counter 241 may perform a counting up/down operation in response to the detection signals UP_DET, DN_DET, and HOLD to generate counting signals CNT<0:2>. When the first detection signal UP_DET is activated, the up/down counter 241 performs a counting up operation. When the second detection signal DN_DET is activated, the up/down counter 241 performs a counting down operation. When the third detection signal HOLD is activated, the up/down counter 241 holds the counting operation.

The latch 242 may latch the counting signals CNT<0:2> to output a pulse information SAP3PW_INFO<0:2> of the third pull-up driving signal.

The decoder 243 may decode the pulse information SAP3PW_INFO<0:2> to generate pulse signals SAP3PW<0:7>.

The output part 244 may output the set pulse SAP_SET having an activation timing corresponding to an activated or selected) signal of the pulse signals SAP3PW<0:7>.

Figure 4:
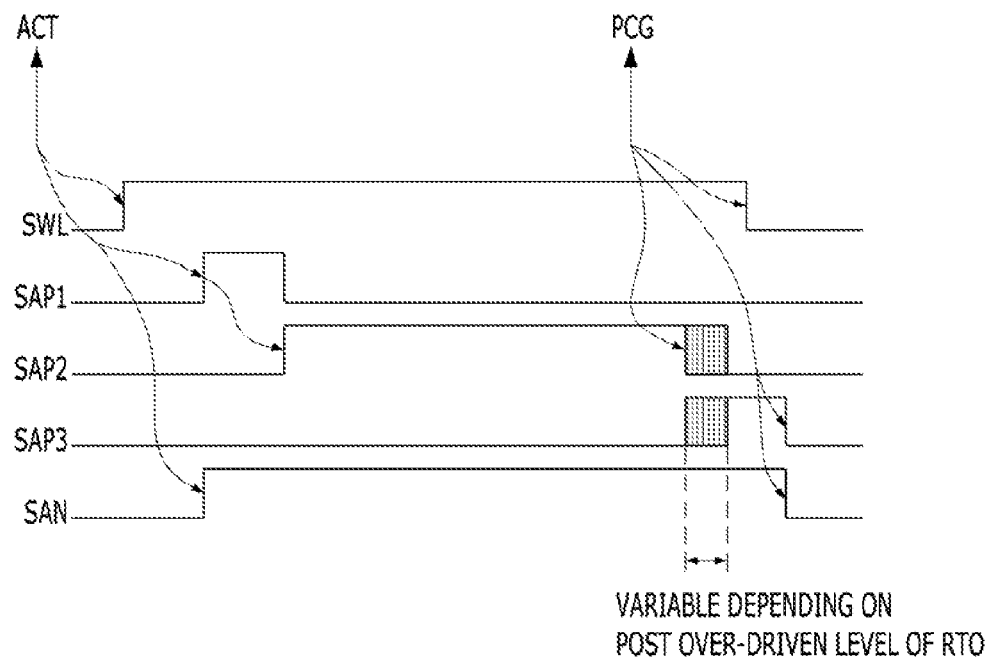
FIG. 4 is a timing diagram for describing an operation of a semiconductor device illustrated in FIG. 1.

FIG. 4 is a timing diagram for describing an operation of the semiconductor device illustrated in FIG. 1.

Figure 5:
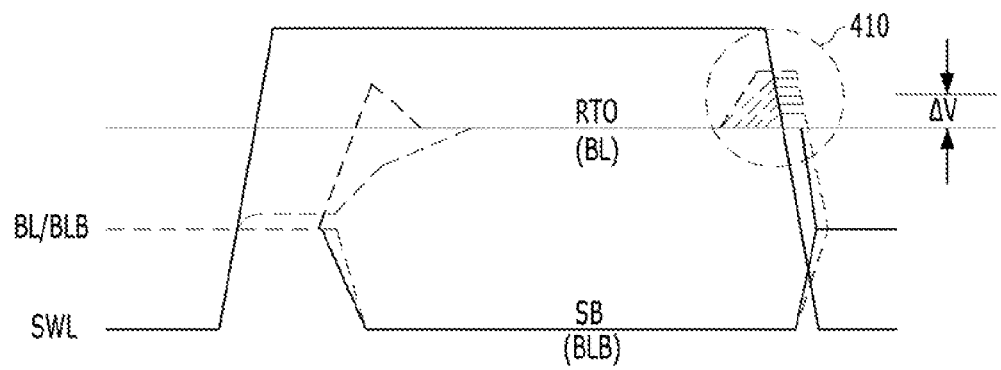
FIG. 5 is a wave form diagram for describing an operation of the semiconductor device illustrated in FIG. 1

FIG. 5 is a wave form diagram for describing the operation of the semiconductor device illustrated in FIG. 1. FIG. 5 shows a change in the voltage level of the bit line pair BL and BLB according to the operation shown in FIG. 4.

Figure 6:
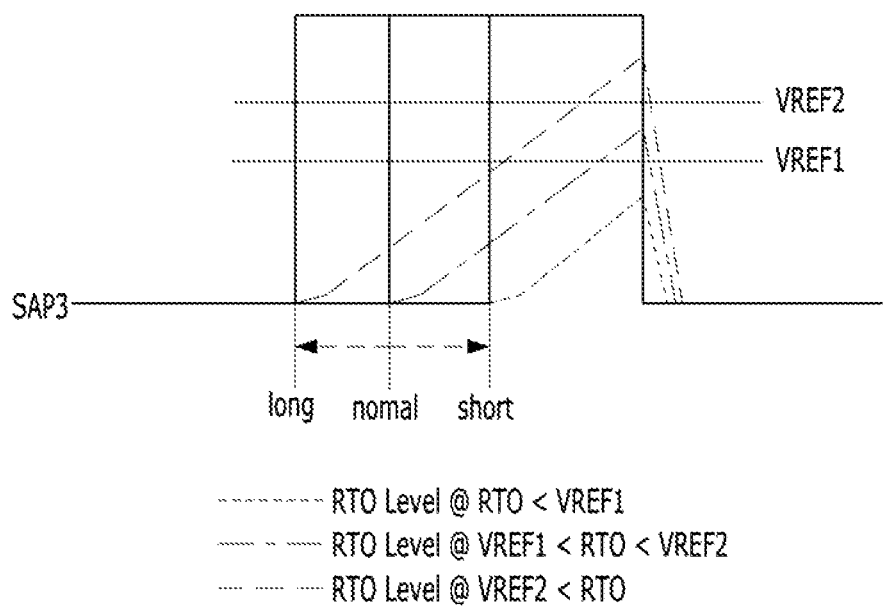
FIG. 6 is a conceptual diagram for describing an operation of the semiconductor device illustrated in FIG. 1, in a post over-driving period.

FIG. 6 is a conceptual diagram for describing an operation of the semiconductor device illustrated in FIG. 1, in a post over-driving (POD) period.

Referring to FIG. 4 to FIG. 6, a word line SWL may be activated at a high logic level during a period corresponding to the active mode and deactivated to a low logic level during a period corresponding to the precharge mode. For example, the word line SWL may be activated in response to an active command ACT and may be deactivated in response to a precharge command PCG. The period corresponding to the active mode may not match with the active mode. The period corresponding to the precharge mode may not match with the precharge mode. For example, the word line SWL may be in an activated state even in an initial partial period (i.e., a POD period) of the precharge mode.

The first pull-up driving signal SAP1 may be activated during an initial partial period (i.e., an over-driving period) of the active mode, the second pull-up driving signal SAP2 may be activated during the remaining period of the active mode after the first pull-up driving signal SAP1 is deactivated, and the third pull-up driving signal SAP3 may be activated during an initial period (i.e., a post over-driving period) of the precharge mode after the second pull-up driving signal SAP2 is deactivated. The third pull-up driving signal SAP3 may have its activation timing adjusted according to a control operation by the post over-over driving unit 170, and the deactivation timing of the second pull-up driving signal SAP2 may be adjusted according to the adjusted activation timing of the third pull-up driving signal SAP3. In other words, the deactivation timing of the second pull-up driving signal SAP2 may be varied according to the activation timing of the third pull-up driving signal SAP3. The pull-down driving signal SAN may be in an activated state during the initial partial period and the remaining period of the active mode and the initial period of the precharge mode. For example, the first to third pull-up driving signals SAP1 to SAPS and the pull-down driving signal SAN may be generated based on the active command ACT and the precharge command PCG.

When an active command ACT is applied (i.e., when entering into the active mode), in the memory cell 110, the cell transistor T is turned on, so that charges may be shared between the bit line BL and the cell capacitor C. If data having a value of '1' (high logic level) has been stored in the cell capacitor C, the bit line BL may increase from a level of the bit line precharge voltage VBLP by a predetermined voltage level. Accordingly, a predetermined voltage difference may be generated between the bit line BL and the complementary bit line BLB.

In such a state, the first pull-up driving section P1 may drive the pull-up power line RTO by the power supply voltage VDD during the first active period of the active mode in response to the first pull-up driving signal SAP1, and the first pull-down driving section N1 may drive the pull-down power line SB by the ground voltage VSS during the first active period in response to the pull-down driving signal SAN. Then, the sense amplification unit 120 may sense and amplify data loaded on the bit line pair BL and BLB by using the power supply voltage VDD and the ground voltage VSS. As described above an operation, in which data is amplified by a target voltage (e.g., the power supply voltage VDD) during the initial period of the active mode, is called an over-driving operation.

The second pull-up driving section P2 may drive the pull-up power line RTO by the core voltage VCORE during the remaining period of the active mode in response to the second pull-up driving signal SAP2, and the first pull-down driving section N1 may drive the pull-down power line SB by the ground voltage VSS during the remaining period of the active mode in response to the pull-down driving signal SAN. Then, during the remaining period of the active mode, the sense amplification unit 120 may substantially maintain the voltage level of the bit line BL to the level of the core voltage VCORE and substantially maintain the voltage level of the complementary bit line BLB to the ground voltage VSS.

When a precharge command PCG is applied (i.e., when entering into the precharge mode), the third pull-up driving section P3 may drive the pull-up power line RTO by the boosted voltage VPUMP during the post over-driving (POD) period (i.e., the initial period of the precharge mode) in response to the third pull-up driving signal SAPS, and the first pull-down driving section N1 may drive the pull-down power line SB by the ground voltage VSS during the POD period in response to the pull-down driving signal SAN. Then, during the POD period, the sense amplification unit 120 may amplify the voltage level of the bit line BL by the boosted voltage VPUMP while driving the complementary bit line bar by the ground voltage VSS. In other words, the sense amplification unit 120 may perform the over-driving operation during the initial period of the precharge mode. Meanwhile, the POD period 410, corresponding to an activation period of the third pull-up driving signal SAP3, may be adjusted according to the control operation of the post over-driving control unit 170 illustrated in FIGS. 1 to 3. For example, when the POD voltage level is determined to be lower than that of the first reference voltage VREF1 (i.e., when the pulse width of the third pull-up driving signal SAP3 is short), the pulse width of the third pull-up driving signal SAP3 may be increased by the counting up operation. Furthermore, when the POD voltage level is determined to be lower than that of the second reference voltage VREF2 (i.e., when the pulse width of the third pull-up driving signal SAP3 is long), the pulse width of the third pull-up driving signal SAP3 may be decreased by the counting down operation. Furthermore, when the POD voltage level is determined to be higher than that of the first reference voltage VREF1 and lower than that of the second reference voltage VREF2 (i.e., when the pulse width of the third pull-up driving signal SAP3 is normal), the pulse width of the third pull-up driving signal SAP3, which is set according to the pulse information SAP3PW_INFO<0:2> latched in the latch 242 in the previous active/precharge mode. The pulse width of the third pull-up driving signal SAP3 may be adjusted, and the adjusted third pull-up driving signal SAP3 may be used in the next active/precharge mode. In this way, the pulse width of the third pull-up driving signal SAP3, that is, the post over-driving period, may be optimized.

Thereafter, the first precharge unit 150 may precharge the bit line pair BL and BLB by the bit line precharge voltage VBLP during the remaining period of the precharge mode, and the second precharge unit 160 may precharge the pull-up power line RTO and the pull-down power line SB by the bit line precharge voltage VBLP during the remaining period of the precharge mode.

By performing the post over-driving operation, data having a high logic level corresponding to the boosted voltage VPUMP may be re-written into the cell capacitor C, and a data retention time may be improved.

However, the pulse width of the third pull-up driving signal SAP3 is sensitive to a change in external environments such as PVT (Process, Voltage, and Temperature). In accordance with embodiments of the present invention, it is possible to adjust the third pull-up driving signal SAP3 to have an optimized pulse width, and to also optimize the voltage level of the bit line BL to be re-written. Thus, it is possible to charge a constant amount of electrical charges, for example, electrical charges corresponding to a delta voltage ΔV, in the memory cell 110 regardless of the PVT change. Consequently, it is possible to effectively perform the post over-driving, resulting in the reduction of current consumption.

Furthermore, in accordance with an embodiment of the present invention, a time (i.e., tWR) for re-write data to the memory cell 110 may be improved by the post over-driving operation during the initial period of the precharge mode.

Although various embodiments have been described for illustrative purposes, it will be apparent to those skilled in the art that various changes and modifications may be made without departing from the spirit and/or scope of the invention as defined in the following claims.

What is claimed is:
1. A semiconductor device comprising:
a sense amplification unit suitable for sensing and amplifying data loaded on a data line pair;
a pull-up driving unit suitable for supplying a first voltage to a pull-up power line of the sense amplification unit as a pull-up driving voltage during an initial period of an active mode, supplying a second voltage lower than the first voltage to the pull-up power line as the pull-up driving voltage during a remaining period of the active mode, and supplying a third voltage higher than the first voltage to the pull-up power line as the pull-up driving voltage during an initial period of a precharge;
a pull-down driving unit suitable for supplying a fourth voltage to a pull-down power line of the sense amplification unit as a pull-down driving voltage during the active mode and the initial period of the precharge mode; and
a post over-driving control unit suitable for adjusting the initial period of the precharge mode by detecting a voltage level of the pull-up power line.
2. The semiconductor device of claim 1, wherein the pull-up driving unit comprises:
a first pull-up driving section suitable for driving the pull-up power line by the first voltage and the second voltage in response to a first pull-up driving signal in the active mode; and
a second pull-up driving section suitable for driving the pull-up power line by the third voltage in response to a second pull-up driving signal during the initial period of the precharge mode, wherein the post over-driving control unit adjusts a pulse width of the second pull-up driving signal.

3. The semiconductor device of claim 2, wherein the post over-driving control unit comprises:
a set pulse generating unit suitable for detecting the driven level of the pull-up power line during the initial period of the precharge mode, and generating a set pulse in response to the detected driven level; and
a third pull-up driving signal generating unit suitable for generating the third pull-up driving signal in response to the set pulse and a reset pulse.

4. The semiconductor device of claim 3, wherein the set pulse generating unit comprises:
a reference voltage generation section suitable for dividing the third voltage to generate a first reference voltage and a second reference voltage that is higher than the first reference voltage;
a comparison section suitable for comparing a voltage level of the pull-up power line with the first and second reference voltages;
a determining section suitable for determining the voltage level of the pull-up power line based on the comparison result of the comparison section to generate detection signals; and
a pulse width control section suitable for adjusting an activation timing of the set pulse in response to the detection signals.

5. The semiconductor device of claim 4, wherein the pulse width control section comprises:
an up/down counter suitable for performing a counting up/down operation in response to the detection signals to generate counting signals;
a latch suitable for latching the counting signals to output a pulse width information;
a decoder suitable for decoding the outputted pulse width information to generate pulse signals; and
an output part suitable for outputting the set pulse having an activation timing corresponding to an activated signal of the pulse signals.

6. The semiconductor device of claim 4, wherein the comparison section comprises:
a first comparator suitable for comparing the voltage level of the pull-up power line with the first reference voltage; and
a second comparator suitable for comparing the voltage level of the pull-up power line with the second reference voltage.

7. The semiconductor device of claim 5, wherein the determining section activates a first detection signal when the voltage level of the pull-up power line is determined to be lower than the first reference voltage, activates a second detection signal when the voltage level of the pull-up power line is determined to be higher than the second reference voltage, and activates a third detection signal when the voltage level of the pull-up power line is determined to be higher than the first reference voltage and lower than the second reference voltage.

8. The semiconductor device of claim 7, wherein the up/down counter performs the counting up/down operation in response to the first and second detection signals and holds the counting up/down operation when the third detection signal is activated.

9. The semiconductor device of claim 1, further comprising:
a first precharge unit suitable for precharging the data line pair by a precharge voltage during a remaining period of the precharge mode; and a second precharge unit suitable for precharging the pull-up power line and the pull-down power line by the precharge voltage during the remaining period of the precharge mode,
wherein the precharge voltage has a voltage level corresponding to a half of the first voltage.

10. The semiconductor device of claim 9, wherein the first voltage includes a core voltage generated by voltage-dropping a power supply voltage VDD supplied from an external, the second voltage includes a boosted voltage generated by boosting the power supply voltage, the third voltage includes a ground voltage supplied from the external, and the precharge voltage includes a bit line precharge voltage.

11. A semiconductor device comprising:
a bit line pair;
a memory cell coupled to one of the bit line pair;
a sense amplification unit suitable for sensing and amplifying data loaded on the bit line pair;
a pull-up driving unit suitable for supplying a first voltage to a pull-up power line of the sense amplification unit as a pull-up driving voltage during an initial period of an active mode, supplying a second voltage lower than the first voltage to the pull-up power line as the pull-up driving voltage during a remaining period of the active mode, and supplying a third voltage higher than the first voltage to the pull-up power line as the pull-up driving voltage during an initial period of a precharge mode;
a pull-down driving unit suitable for supplying a fourth voltage to a pull-down power line of the sense amplification unit as a pull-down driving voltage during the active mode and the initial period of the precharge mode;
a post over-driving control unit suitable for adjusting the initial period of the precharge mode by detecting a voltage level of the pull-up power line; and
a first precharge unit suitable for precharging the bit line pair by a precharge voltage during a remaining period of the precharge mode,
wherein the third voltage is higher than the first voltage and the second voltage (VCORE).

12. The semiconductor device of claim 11, wherein the pull-up driving unit comprises:
a first pull-up driving section suitable for driving the pull-up power line by the first voltage in response to a first pull-up driving signal during the initial period of the active mode;
a second pull-up driving section suitable for driving the pull-up power line by the second voltage in response to a second pull-up driving signal during the remaining period of the active mode; and
a third pull-up driving section suitable for driving the pull-up power line by the third voltage in response to a third pull-up driving signal during the initial period of the precharge mode.

13. The semiconductor device of claim 12, wherein the post over-driving control unit comprises:
a set pulse generating unit suitable for detecting the driven level of the pull-up power line during the initial period of the precharge mode, and generating a set pulse in response to the detected driven level; and
a third pull-up driving signal generating unit suitable for generating the third pull-up driving signal in response to the set pulse and a reset pulse.

14. The semiconductor device of claim 13, wherein the post over-driving control unit comprises:

a reference voltage generation section suitable for dividing the third voltage to generate a first reference voltage and a second reference voltage that is higher than the first reference voltage;

a comparison section suitable for comparing a voltage level of the pull-up power line with the first and second reference voltages;

a determining section suitable for determining the voltage level of the pull-up power line based on the comparison result of the comparison section to generate detection signals; and a pulse width control section suitable for adjusting an activation timing of the set pulse in response to the detection signals.

15. The semiconductor device of claim 13, wherein the pulse width control section comprises:

an up/down counter suitable for performing a counting up/down operation in response to the detection signals to generate counting signals;

a latch suitable for latching the counting signals to output a pulse width information;

a decoder suitable for decoding the outputted pulse width information to generate pulse signals; and an output part suitable for outputting the set pulse having an activation timing corresponding to an activated signal of the pulse signals.

16. The semiconductor device of claim 13, wherein the comparison section comprises:

a first comparator suitable for comparing the voltage level of the pull-up power line with the first reference voltage; and a second comparator suitable for comparing the voltage level of the pull-up power line with the second reference voltage.

17. The semiconductor device of claim 15, wherein the determining section activates a first detection signal when the voltage level of the pull-up power line is determined to be lower than the first reference voltage, activates a second detection signal when the voltage level of the pull-up power line is determined to be higher than the second reference voltage, and activates a third detection signal when the voltage level of the pull-up power line is determined to be higher than the first reference voltage and lower than the second reference voltage.

18. The semiconductor device of claim 17, wherein the up/down counter performs the counting up/down operation in response to the first and second detection signals and holds the counting up/down operation when the third detection signal is activated.

19. The semiconductor device of claim 13, wherein the first voltage includes a power supply voltage supplied from an external and the fourth voltage includes a ground voltage supplied from the external.

20. The semiconductor device of claim 19, wherein the second voltage includes a core voltage generated by voltage-dropping the power supply voltage and the third voltage includes a boosted voltage generated by boosting the power supply voltage, wherein the precharge voltage has a voltage level corresponding to a half of the core voltage.

21. The semiconductor device of claim 11, further comprising:

a second precharge unit suitable for precharging the pull-up power line and the pull-down power line by the precharge voltage during the remaining period of the precharge mode.

* * * * *